(12) United States Patent
Shindo

(10) Patent No.: US 12,733,437 B2
(45) Date of Patent: Sep. 8, 2026

(54) SUBSTRATE PROCESSING SYSTEM AND SUBSTRATE TRANSFER METHOD

(71) Applicant: TOKYO ELECTRON LIMITED, Tokyo (JP)

(72) Inventor: Takehiro Shindo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 500 days.

(21) Appl. No.: 18/113,374

(22) Filed: Feb. 23, 2023

(65) Prior Publication Data

US 2023/0282503 A1 Sep. 7, 2023

(30) Foreign Application Priority Data

Mar. 7, 2022 (JP) ................................ 2022-034267

(51) Int. Cl.

| | |
|---|---|
| ***H10P 72/30*** | (2026.01) |
| ***B65G 54/02*** | (2006.01) |
| ***H01F 7/20*** | (2006.01) |
| ***H10P 72/00*** | (2026.01) |
| ***H10P 72/76*** | (2026.01) |

(52) U.S. Cl.

CPC .......... *H10P 72/3204* (2026.01); *B65G 54/02* (2013.01); *H01F 7/206* (2013.01); *H10P 72/0454* (2026.01); *H10P 72/3306* (2026.01); *H10P 72/7602* (2026.01)

(58) Field of Classification Search

None

See application file for complete search history.

(56) References Cited

U.S. PATENT DOCUMENTS

| | | | | |
|---|---|---|---|---|
| 8,380,337 | B2 | 2/2013 | Hiroki | |
| 10,056,279 | B2 * | 8/2018 | Janakiraman | H01L 21/67709 |
| 11,476,139 | B2 * | 10/2022 | Moura | B65G 54/02 |
| 2011/0238201 | A1 | 9/2011 | Hiroki | |
| 2012/0213615 | A1 | 8/2012 | Sakaue | |
| 2014/0052286 | A1 * | 2/2014 | Sakaue | G05B 19/4189 700/112 |

(Continued)

FOREIGN PATENT DOCUMENTS

| | | |
|---|---|---|
| JP | H11-330190 A | 11/1999 |
| JP | 2005019960 A | 1/2005 |

(Continued)

*Primary Examiner* — Michael S Lowe
(74) *Attorney, Agent, or Firm* — Fenwick & West LLP

(57) ABSTRACT

There is provided a substrate processing system comprising: a plurality of modules including a processing chamber in which a substrate is held and processing is performed on the substrate; a transfer chamber to which the plurality of modules are connected; a substrate transfer device provided inside the transfer chamber, for transferring the substrate to the plurality of modules and taking out the substrate from the plurality of modules; and a controller. The substrate transfer device includes a first transfer unit and a second transfer unit, each of which places thereon the substrate and is linearly movable and swivelable independently and freely over a surface of the transfer chamber, and the controller controls the substrate transfer device such that a substrate replacement operation is performed from one module to another module among the plurality of modules by moving the first transfer unit and the second transfer unit concurrently in parallel.

11 Claims, 8 Drawing Sheets

(56) References Cited

U.S. PATENT DOCUMENTS

| | | | |
|---|---|---|---|
| 2016/0218029 A1* | 7/2016 | Janakiraman | ..... H01L 21/67709 |
| 2022/0037181 A1 | 2/2022 | Hatano et al. | |
| 2022/0415688 A1 | 12/2022 | Hatano et al. | |

FOREIGN PATENT DOCUMENTS

| | | |
|---|---|---|
| JP | 2018-504784 A | 2/2018 |
| JP | 2021-086986 A | 6/2021 |
| KR | 10-2010-0089107 A | 8/2010 |
| KR | 10-2014-0008380 A | 1/2014 |
| KR | 10-2022-0015324 A | 2/2022 |
| WO | WO 2011/040301 A1 | 4/2011 |
| WO | WO 2016/118335 A1 | 7/2016 |

* cited by examiner 100
111
G
120
150
10
121
110
21
22
30
50
W
G1
131
130
G2
140
160
70

| | LLM | LLM GV | Mover1 | Mover2 | PM GV | PM |
|---|---|---|---|---|---|---|
| 0 | ○ | OPEN | × | PM to LLM ● | Close | PROCESS |
| 1 | × | ↑ | LLM GET ○ | ↑ | ↑ | ↑ |
| 2 | ● | ↑ | LLM to PM ○ | LLM PUT × | ↑ | ↑ |
| 3 | ↑ | Close | ↑ | LLM to PM × | ↑ | ● |
| 4 | INTAKE AND EXHAUST | ↑ | ↑ | ↑ | OPEN | ↑ |
| 5 | ↑ | ↑ | ↑ | PM GET ● | ↑ | × |
| 6 | ↑ | ↑ | PM PUT × | PM to LLM ● | ↑ | ○ |
| 7 | ○ | ↑ | PM to LLM × | ↑ | Close | ↑ |
| 8 | ↑ | OPEN | ↑ | ↑ | ↑ | PROCESS |
| 9 | × | ↑ | LLM GET ○ | ↑ | ↑ | ↑ |
| 10 | ● | ↑ | LLM to PM ○ | LLM PUT × | ↑ | ↑ |
| 11 | ↑ | Close | ↑ | LLM to PM × | ↑ | ● |
| 12 | INTAKE AND EXHAUST | ↑ | ↑ | ↑ | OPEN | ↑ |
| 13 | ↑ | ↑ | ↑ | PM GET ● | ↑ | × |
| 14 | ↑ | ↑ | PM PUT × | PM to LLM ● | ↑ | ○ |
| 15 | ○ | ↑ | PM to LLM × | ↑ | Close | ↑ |
| 16 | ↑ | OPEN | ↑ | ↑ | ↑ | PROCESS |
| 17 | × | ↑ | LLM GET ○ | ↑ | ↑ | ↑ |
| 18 | ● | ↑ | LLM to PM ○ | LLM PUT × | ↑ | ↑ |
| 19 | ↑ | Close | ↑ | LLM to PM × | ↑ | ● |
| 20 | INTAKE AND EXHAUST | ↑ | ↑ | ↑ | OPEN | ↑ |
| 21 | ↑ | ↑ | ↑ | PM GET ● | ↑ | × |
| 22 | ↑ | ↑ | PM PUT × | PM to LLM ● | ↑ | ○ |
| 23 | ○ | ↑ | PM to LLM × | ↑ | Close | ↑ |
| 24 | ↑ | OPEN | ↑ | ↑ | ↑ | PROCESS |

*FIG.8*

| | LLM | LLM GV | Mover1 | Mover2 | Mover3 | PM GV | PM |
|---|---|---|---|---|---|---|---|
| 0 | ○ | OPEN | × | PM to LLM ● | × | Close | PROCESS |
| 1 | × | ↑ | LLM GET ○ | ↑ | ↑ | ↑ | ↑ |
| 2 | ● | ↑ | LLM to PM ○ | LLM PUT × | ↑ | ↑ | ↑ |
| 3 | ↑ | Close | ↑ | ↑ | ↑ | ↑ | ● |
| 4 | INTAKE AND EXHAUST | ↑ | ↑ | ↑ | ↑ | OPEN | ↑ |
| 5 | ↑ | ↑ | ↑ | ↑ | PM GET ● | ↑ | × |
| 6 | ↑ | ↑ | PM PUT × | ↑ | PM to LLM ● | ↑ | ○ |
| 7 | ○ | ↑ | ↑ | ↑ | ↑ | Close | ↑ |
| 8 | ↑ | OPEN | ↑ | ↑ | ↑ | ↑ | PROCESS |
| 9 | × | ↑ | ↑ | LLM GET ○ | ↑ | ↑ | ↑ |
| 10 | ● | ↑ | ↑ | LLM to PM ○ | LLM PUT × | ↑ | ↑ |
| 11 | ↑ | Close | ↑ | ↑ | ↑ | ↑ | ● |
| 12 | INTAKE AND EXHAUST | ↑ | ↑ | ↑ | ↑ | OPEN | ↑ |
| 13 | ↑ | ↑ | PM GET ● | ↑ | ↑ | ↑ | × |
| 14 | ↑ | ↑ | PM to LLM ● | PM PUT × | ↑ | ↑ | ○ |
| 15 | ○ | ↑ | ↑ | ↑ | ↑ | Close | ↑ |
| 16 | ↑ | OPEN | ↑ | ↑ | ↑ | ↑ | PROCESS |
| 17 | × | ↑ | ↑ | ↑ | LLM GET ○ | ↑ | ↑ |
| 18 | ● | ↑ | LLM PUT × | ↑ | LLM to PM ○ | ↑ | ↑ |
| 19 | ↑ | Close | ↑ | ↑ | ↑ | ↑ | ● |
| 20 | INTAKE AND EXHAUST | ↑ | ↑ | ↑ | ↑ | OPEN | ↑ |
| 21 | ↑ | ↑ | ↑ | PM GET ● | ↑ | ↑ | × |
| 22 | ↑ | ↑ | ↑ | PM to LLM ● | PM PUT × | ↑ | ○ |
| 23 | ○ | ↑ | ↑ | ↑ | ↑ | Close | ↑ |
| 24 | ↑ | OPEN | ↑ | ↑ | ↑ | ↑ | PROCESS |

SUBSTRATE PROCESSING SYSTEM AND SUBSTRATE TRANSFER METHOD

CROSS-REFERENCE TO RELATED APPLICATIONS

This application claims priority to Japanese Patent Application No. 2022-034267 filed on Mar. 7, 2022, the entire contents of which are incorporated herein by reference.

TECHNICAL FIELD

The present disclosure relates to a substrate processing system and a substrate transfer method.

BACKGROUND

For example, in a semiconductor manufacturing process, when processing a semiconductor wafer as a substrate, a substrate processing system having a structure in which a plurality of modules such as processing chambers and load-lock chambers are provided around a vacuum transfer chamber having a substrate transfer device is used.

As the substrate transfer device for the substrate processing system, there has been proposed a substrate transfer device including: first and second substrate holders having first and second swiveling parts which are swivelable about a common swiveling axis and provided in the first and second swiveling parts so as to move back and forth respectively; first and second advance/retreat drivers for advancing and retreating the first and second substrate holders, respectively; and first and second swivel drivers for respectively driving the first and second swiveling parts (see Patent Document 1).

SUMMARY

The present disclosure provides a substrate processing system and a substrate transfer method capable of performing a substrate replacement operation with a high degree of freedom and a high throughput for a plurality of modules.

In accordance with an aspect of the present disclosure, there is provided a substrate processing system comprising: a plurality of modules including a processing chamber in which a substrate is held and processing is performed on the substrate; a transfer chamber to which the plurality of modules are connected; a substrate transfer device provided in the transfer chamber, for transferring the substrate to the plurality of modules and taking out the substrate from the plurality of modules; and a controller. The substrate transfer device includes a first transfer unit and a second transfer unit, each of which places thereon the substrate and is linearly movable and swivelable independently and freely over a surface of the transfer chamber, and the controller controls the substrate transfer device such that a substrate replacement operation is performed from one module to another module among the plurality of modules by moving the first transfer unit and the second transfer unit concurrently in parallel.

BRIEF DESCRIPTION OF THE DRAWINGS

The objects and features of the present disclosure will become apparent from the following description of embodiments, given in conjunction with the accompanying drawings, in which:

FIG. 5 is a diagram showing a sequence including the substrate replacement operation in the first embodiment in tabular form for each process;

FIG. 8 is a diagram showing a sequence including the substrate replacement operation in the second embodiment in tabular form for each process.

DETAILED DESCRIPTION

Embodiments will be described below with reference to the accompanying drawings.

First Embodiment

Figure 1:
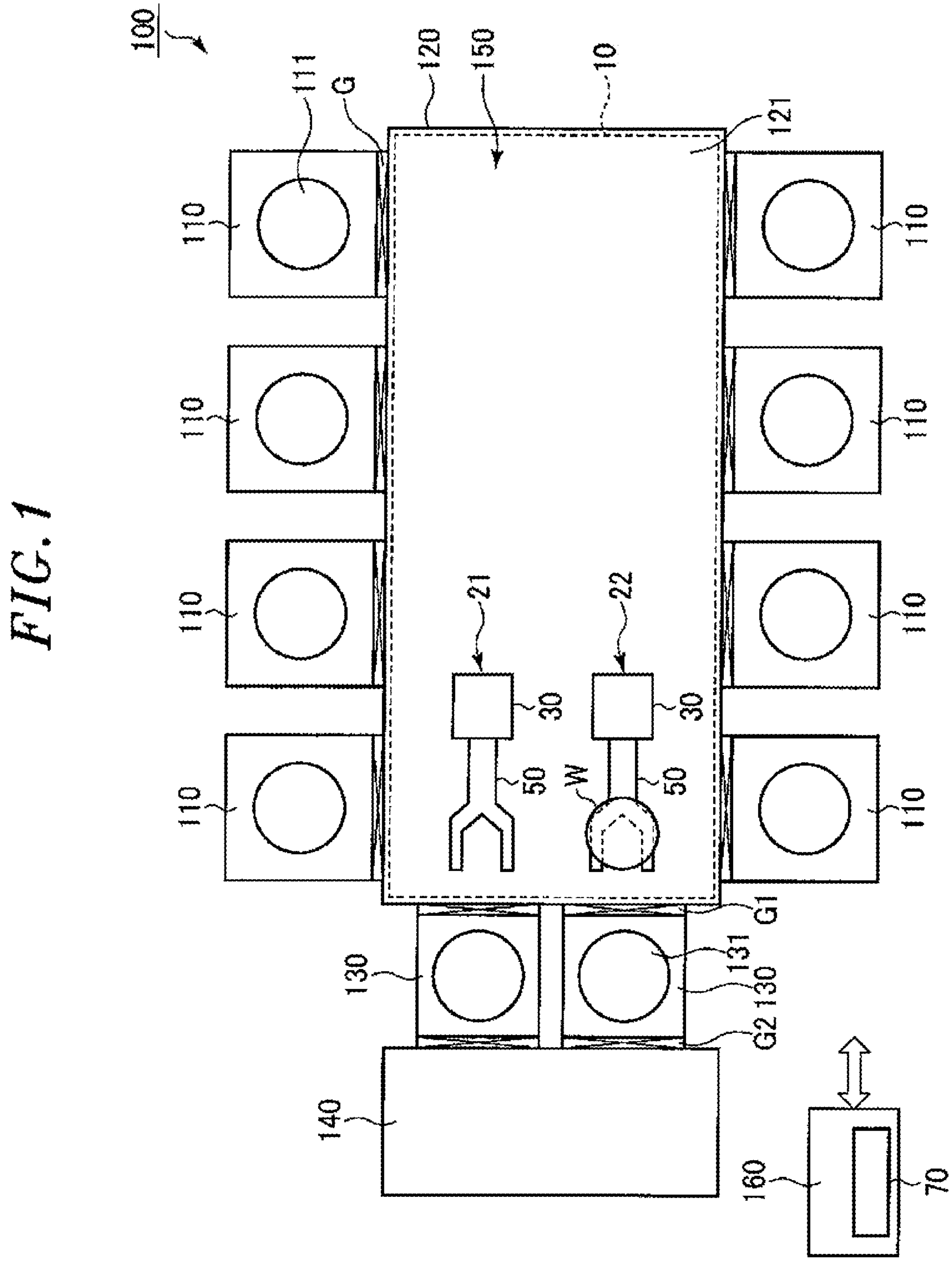
FIG. 1 is a schematic plan view showing a substrate processing system according to a first embodiment.

FIG. 1 is a schematic plan view showing a substrate processing system according to a first embodiment.

A substrate processing system 100 of the present embodiment continuously processes a plurality of substrates. The processing of the substrate is not particularly limited, and may include various types of processing such as film formation processing, etching processing, ashing processing, and cleaning processing. The substrate is not particularly limited, but a semiconductor wafer is exemplified, for example.

As shown in FIG. 1, the substrate processing system 100 is a multi-chamber type system and includes a plurality of processing chambers 110, a vacuum transfer chamber 120, load-lock chambers 130, an atmospheric transfer chamber 140, a substrate transfer device 150, and a controller 160.

The vacuum transfer chamber 120 has a rectangular planar shape, the interior of which is depressurized to a vacuum atmosphere, and the plurality of processing chambers 110 are connected via gate valves G to walls facing each other on the long sides of the vacuum transfer chamber 120. Further, two load-lock chambers 130 are connected to wall on one of the short sides of the vacuum transfer chamber 120 via gate valves G1. The atmospheric transfer chamber 140 is connected to the two load-lock chambers 130 on the opposite side of the vacuum transfer chamber 120 via gate valves G2. The processing chambers 110 and the load-lock chambers 130 function as modules in which the substrate W is loaded and unloaded.

The substrate transfer device 150 in the vacuum transfer chamber 120 loads/unloads the substrate W into/from the processing chambers 110 and the load-lock chambers 130, and includes a planar motor (linear unit) 10, a first transfer unit 21, a second transfer unit 22, and a transfer controller 70. The details of the substrate transfer device 150 will be described later.

The processing chamber 110 and the vacuum transfer chamber 120 are communicated with each other by opening the gate valve G so that the substrate W can be transferred by the substrate transfer device 150, and are blocked from each other by closing the gate valve G. Further, the load-lock chamber 130 and the vacuum transfer chamber 120 are communicated with each other by opening the gate valve G1 so that the substrate W can be transferred by the substrate transfer device 150, and are blocked from each other by closing the gate valve G1.

The processing chamber 110 has a substrate support 111 on which the substrate W is placed, and performs desired processing (film formation processing, etching processing, ashing processing, cleaning processing, or the like) on the substrate W placed on the substrate support 111 while the inside of the processing chamber is depressurized to a vacuum atmosphere.

The load-lock chamber 130 has a substrate support 131 on which the substrate W is placed, and a pressure therein is controlled between atmospheric pressure and vacuum when the substrate W is transferred between the atmospheric transfer chamber 140 and the vacuum transfer chamber 120.

The atmospheric transfer chamber 140 has an atmospheric atmosphere, and for example, downflow of clean air is formed therein. Further, a load port (not shown) is provided on the wall surface of the atmospheric transfer chamber 140. A carrier (not shown) accommodating the substrate W or an empty carrier is connected to the load port. For example, a front opening unified pod (FOUP) or the like can be used as the carrier.

An atmospheric transfer device (not shown) for transferring the substrate W is provided in the atmospheric transfer chamber 140. The atmospheric transfer device takes out the substrate W accommodated in the load port (not shown) and places it on the substrate support 131 of the load-lock chamber 130, or takes out the substrate W placed on the substrate support 131 of the load-lock chamber 130 and stores it in the load port. The load-lock chamber 130 and the atmospheric transfer chamber 140 are communicated with each other by opening the gate valve G2 so that the substrate W can be transferred by the atmospheric transfer device, and are blocked from each other by closing the gate valve G2.

The controller 160 is configured by a computer, and includes a main controller having a CPU, an input device, an output device, a display device, and a storage device (storage medium). The main controller controls the operation of each component of the substrate processing system 100. For example, the main controller controls the processing of the substrate Win each processing chamber 110, the opening and closing of the gate valves G, G1, and G2, or the like. Control of each component by the main controller is performed based on a processing recipe, which is a control program stored in the storage medium (hard disk, optical disk, semiconductor memory, or the like) incorporated in the storage device.

Further, in this embodiment, the controller 160 includes the transfer controller 70 for controlling the substrate transfer device 150.

Figure 2:
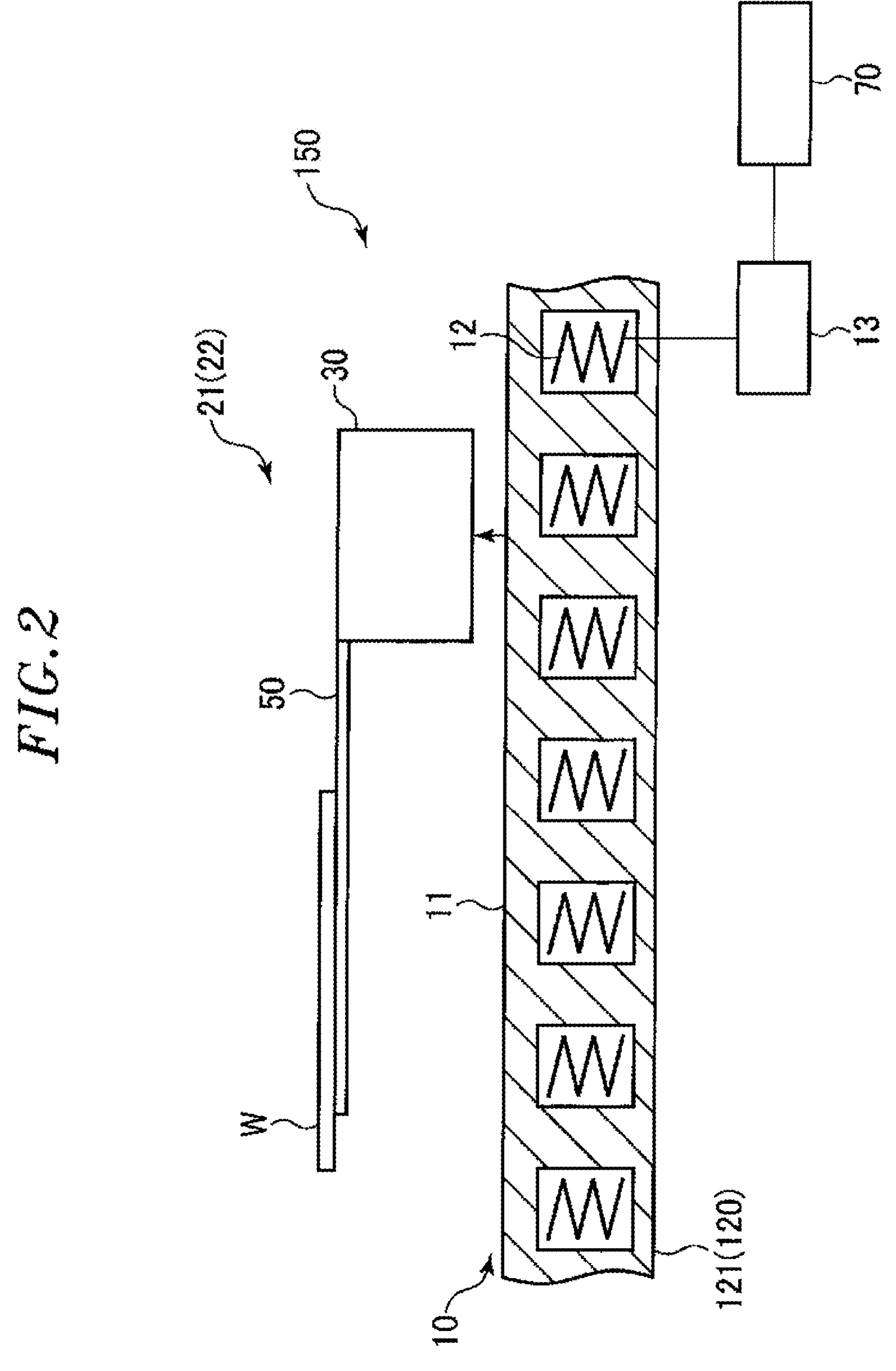
FIG. 2 is a cross-sectional view for explaining a transfer unit and a planar motor in an example of a substrate transfer device.
Figure 3:
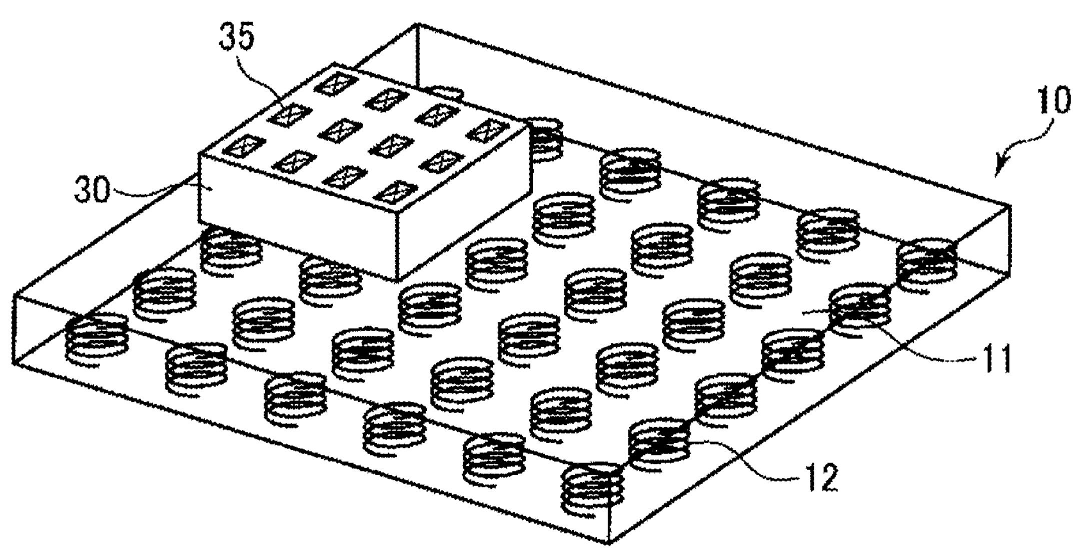
FIG. 3 is a perspective view for explaining a driving principle of the planar motor.

Next, the substrate transfer device 150 according to the present embodiment will be described in detail based on FIGS. 2 and 3 in addition to FIG. 1 described above. FIG. 2 is a cross-sectional view for explaining the transfer unit and the planar motor of the substrate transfer device, and FIG. 3 is a perspective view for explaining the driving principle of the planar motor.

As described above, the substrate transfer device 150 includes the planar motor (linear unit) 10, the first transfer unit 21, and the second transfer unit 22.

The planar motor (linear unit) 10 linearly drives the first transfer unit 21 and the second transfer unit 22. The planar motor (linear unit) 10 includes a main body 11 composed of a bottom wall 121 of the vacuum transfer chamber 120, a plurality of electromagnetic coils 12 arranged throughout the interior of the main body 11, and a linear driver 13 for linearly driving the first transfer unit 21 and the second transfer unit 22 by individually supplying power to the plurality of electromagnetic coils 12. The linear driver 13 is controlled by the transfer controller 70. A magnetic field is generated by supplying a current to the electromagnetic coil 12.

Each of the first transfer unit 21 and the second transfer unit 22 has the same configuration, and includes an end effector 50 that is a substrate holder for holding the substrate W and a base 30.

As shown in FIG. 3, the base 30 has a plurality of permanent magnets 35 arranged therein and is driven by the planar motor (linear unit) 10. As the base 30 is driven, the end effector 50 is moved. By setting the direction of the current supplied to the electromagnetic coil 12 of the planar motor (linear unit) 10 so that the magnetic field generated thereby repels the permanent magnet 35, the base 30 is magnetically levitated from the surface of the main body 11. By stopping the current to the electromagnetic coil 12, the base 30 stops levitating and is placed on the floor of the vacuum transfer chamber 120, that is, the surface of the main body 11 of the planar motor 10. Further, by individually controlling the current supplied from the linear driver 13 to the electromagnetic coils 12 by the transfer controller 70, the position of the base 30 can be controlled by moving the base 30 along the surface of the main body 11 of the planar motor 10 while the base 30 is magnetically levitated. The levitation amount also can be controlled by controlling the current.

In the substrate transfer device 150 configured as described above, the base 30 is magnetically levitated by controlling the current supplied from the linear driver 13 of the planar motor (linear unit) 10 to the electromagnetic coil 12 by the transfer controller 70 to generate the magnetic field that repels the permanent magnet 35. The levitation amount at this time can be controlled by controlling the current.

In the magnetically levitated state, by individually controlling the current supplied from the linear driver 13 to the electromagnetic coils 12, the position of the base 30 can be controlled by moving the base 30 along the surface of the main body 11 of the planar motor 10 (the floor of the vacuum transfer chamber 120). As a result, the first transfer unit 21 and the second transfer unit 22 can be independently and freely moved (linearly movable and swivelable) over a plane along the surface of the main body 11 of the planar motor 10 (the floor of the vacuum transfer chamber 120).

The present embodiment is characterized in that two transfer units, i.e., the first transfer unit 21 and the second transfer unit 22 are used to replace an unprocessed substrate and a processed substrate between the load-lock chamber 130 and the processing chamber 110.

The transfer operation at this time is performed as shown in FIGS. 4A to 4H under the control of the controller 160 (transfer controller 70). FIGS. 4A to 4H are process diagrams for explaining each step of the substrate replacement operation by the substrate transfer device 150, and schematically show a part of the substrate processing system 100. In FIGS. 4A to 4H, for the sake of convenience, the first transfer unit 21 is denoted by "1" and the second transfer unit 22 is denoted by "2".

Figure 4A:
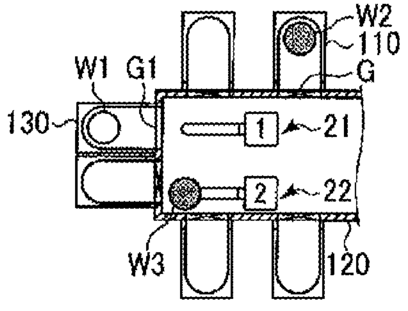
FIGS. 4A to 4H are process diagrams for explaining processes of a substrate replacement operation by the substrate transfer device in the first embodiment.

FIG. 4A shows an initial state in which an unprocessed substrate W1 exists in one load-lock chamber 130, a substrate W2 exists in one processing chamber 110, the first transfer unit 21 is empty, and a processed substrate W3 is placed on the second transfer unit 22. The first transfer unit 21 is positioned at a position corresponding to the load-lock chamber 130 in which the unprocessed substrate W1 exists, and the gate valve G1 of the load-lock chamber 130 is open.

Figure 4E:
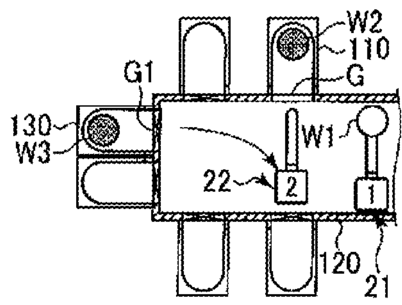
Figure 4B:
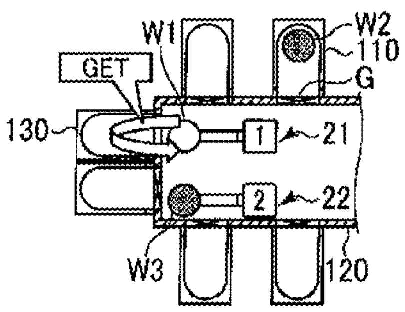

From this state, as shown in FIG. 4B, the unprocessed substrate W1 in the load-lock chamber 130 is taken out by the empty first transfer unit 21 (GET operation).

Figure 4F:
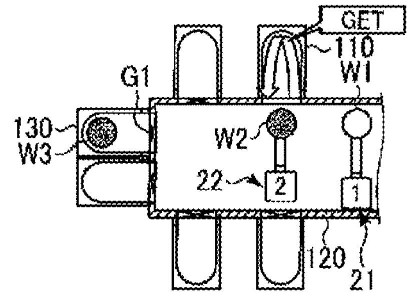
Figure 4C:
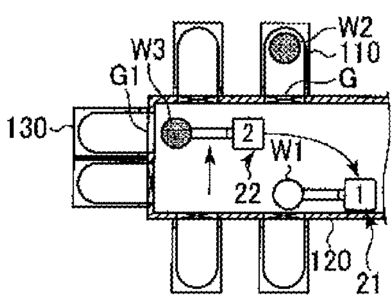

Next, as shown in FIG. 4C, the first transfer unit 21 that has received the unprocessed substrate W1 is retracted, the second transfer unit 22 holding the processed substrate W3 is moved to the position corresponding to the load-lock chamber 130 as a transfer destination, and preparation is made for the transfer of the substrate W3 (PUT preparation).

Figure 4G:
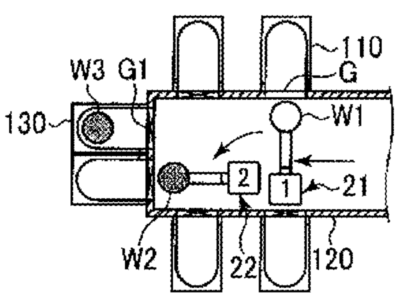
Figure 4D:
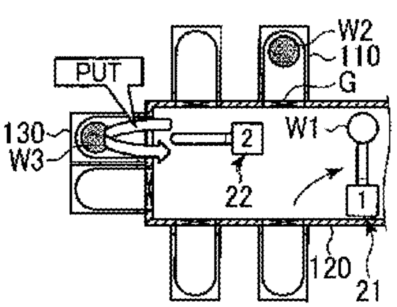

Next, as shown in FIG. 4D, the substrate W3 held by the second transfer unit 22 is transferred to the load-lock chamber 130 (PUT operation), and the first transfer unit 21 holding the substrate W1 is brought into a state of waiting for the substrate W2 to be unloaded from the processing chamber 110. The substrate W2 has processed in the processing chamber 110 in which the substrate W2 exists during FIGS. 4A to 4C, and the processing of the substrate W2 has been completed in FIG. 4D.

Next, as shown in FIG. 4E, the gate valve G1 of the load-lock chamber 130 is closed. Then, the gate valve G of the processing chamber 110 in which the processed substrate W2 exists is opened, and the empty second transfer unit 22 is positioned at a position corresponding to the processing chamber 110 while the first transfer unit 21 is kept in the state of waiting for unloading.

Next, as shown in FIG. 4F, the second transfer unit 22 takes out the processed substrate W2 from the processing chamber 110 (GET operation). At this time, the first transfer unit 21 is kept in the state of waiting for unloading.

Next, as shown in FIG. 4G, the second transfer unit 22 holding the processed substrate W2 is moved to the position corresponding to the load-lock chamber 130 as the transfer destination, and the first transfer unit 21 holding the unprocessed substrate W1 is moved to the position corresponding to the empty processing chamber 110.

Figure 4H:
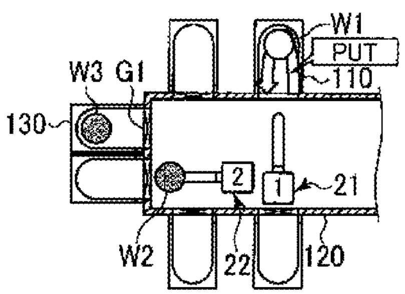

Then, as shown in FIG. 4H, the substrate W1 held by the first transfer unit 21 is transferred to the processing chamber 110 (PUT operation).

FIG. 5 is a diagram showing a sequence including the substrate replacement operation as described above in tabular form for each process. In FIG. 5, LLM indicates the load-lock chamber 130, PM indicates the processing chamber 110, LLM GV indicates the gate valve G1 of the load-lock chamber 130, PM GV indicates the gate valve G of the processing chamber 110, Mover1 indicates the first transfer unit 21, and Mover2 indicates the second transfer unit 22. Further, the numbers in the leftmost column indicate sequence numbers. In the columns of LLM and PM, × indicates the absence of a substrate, ○ indicates the presence of an unprocessed substrate, and ● indicates the presence of a processed substrate. Further, the column of Mover1 and the column of Mover2 show the state of the first transfer unit 21 and the state of the second transfer unit 22, respectively. Specifically, GET indicates taking out a substrate, and PUT indicates transferring the substrate. For example, LLM GET indicates taking out a substrate from the load-lock chamber 130 and PM PUT indicates transferring the substrate to the processing chamber 110. Further, LLM to PM indicates movement from the position corresponding to the load-lock chamber 130 toward the position corresponding to the processing chamber 110, and PM to LLM indicates movement from the position corresponding to the processing chamber 110 toward the position corresponding to the load-lock chamber 130. Further, in the columns of Mover1 and Mover2, × indicates that no substrate is placed, ○ indicates that an unprocessed substrate is placed, and ● indicates that a processed substrate is placed.

In FIG. 5, number 0 indicates the initial state, numbers 1 to 8 indicate a first substrate replacement operation, numbers 9 to 16 indicate a second substrate replacement operation, and numbers 17 to 24 indicate a third substrate replacement operation. In the present embodiment, the first to the third substrate replacement operations have the same sequence.

As shown in FIG. 5, in the present embodiment, the taking out and transferring operations of the substrate by Mover1 and Mover2 and the opening and closing operations of PM GV and LLM GV are performed concurrently in parallel, thereby replacing the substrate between LLM and PM.

Specifically, in number 1, the GET operation of taking out the unprocessed substrate (W1) from LLM by Mover1 is performed as a main operation. In number 2, the PUT operation of transferring the processed substrate (W3) to LLM by Mover2 is performed as a main operation, and, at the same time, Mover1 holding the unprocessed substrate (W1) is moved toward PM as a parallel operation. In number 3, LLM GV is closed as a main operation, and Mover2 is moved toward PM as a parallel operation. In number 4, PM GV is opened as a main operation, and the movement of Mover2 is continued as a parallel operation. In number 5, the GET operation of taking out the processed substrate (W2) from PM by Mover2 is performed as a main operation. In numbers 3 to 5, the position of Mover1 is adjusted as a parallel operation, if necessary. In number 6, the PUT operation of transferring the unprocessed substrate (W1) to PM by Mover1 is performed as a main operation, and, at the same time, Mover2 holding the processed substrate (W2) is moved from PM toward LLM as a parallel operation. In number 7, PM GV is closed as a main operation, and Mover1 is moved from PM toward LLM as a parallel operation. In number 8, LLM GV is opened as a main operation, and Mover1 and Mover2 are moved from PM toward LLM as a parallel operation.

As described above, in the present embodiment, the first transfer unit 21 and the second transfer unit 22 can be independently and freely moved (linearly movable and swivelable) over the plane along the surface of the main body 11 of the planar motor 10 (floor of the vacuum transfer chamber 120). Therefore, as shown in FIGS. 4 and 5, the first transfer unit 21 and the second transfer unit 22 can be moved concurrently in parallel to replace the substrate between the modules. As a result, the substrate replacement operation can be performed with a high degree of freedom and a high throughput regardless of the arrangement of the modules.

Further, in this example, although only the gate valve corresponding to the module is opened when the substrate W is taken out or transferred and it takes time to open and close the gate valve, since the first transfer unit 21 and the second transfer unit 22 can be operated in parallel with the opening and closing period of the gate valve, the throughput can be increased accordingly.

In Japanese Laid-open Patent Publication No. 2005-19960 published on Jan. 20, 2005, the first and second substrate holders are provided in the first and second swiveling parts which are swivelable about the common swiveling axis so as to be movable back and forth, and the first and second advance/retreat drivers and the first and second swivel drivers perform the advancing/retreating operation and the swiveling operation, thereby taking out and transferring the substrate. As a result, the substrate replacement operation can be performed with a high throughput. However, in the case of the technique disclosed in Patent Document 1, the arrangement of the modules for performing the substrate replacement operation is limited, and it is difficult to perform the substrate replacement operation with a high degree of freedom for a plurality of modules in arbitrary arrangement.

On the other hand, in the present embodiment, since the first transfer unit 21 and the second transfer unit 22 can be moved independently and freely, even if the plurality of modules for performing the substrate replacement operation are separated from each other, the substrate replacement operation can be performed, the degree of freedom is high, and the throughput is high.

Second Embodiment

Figure 6:
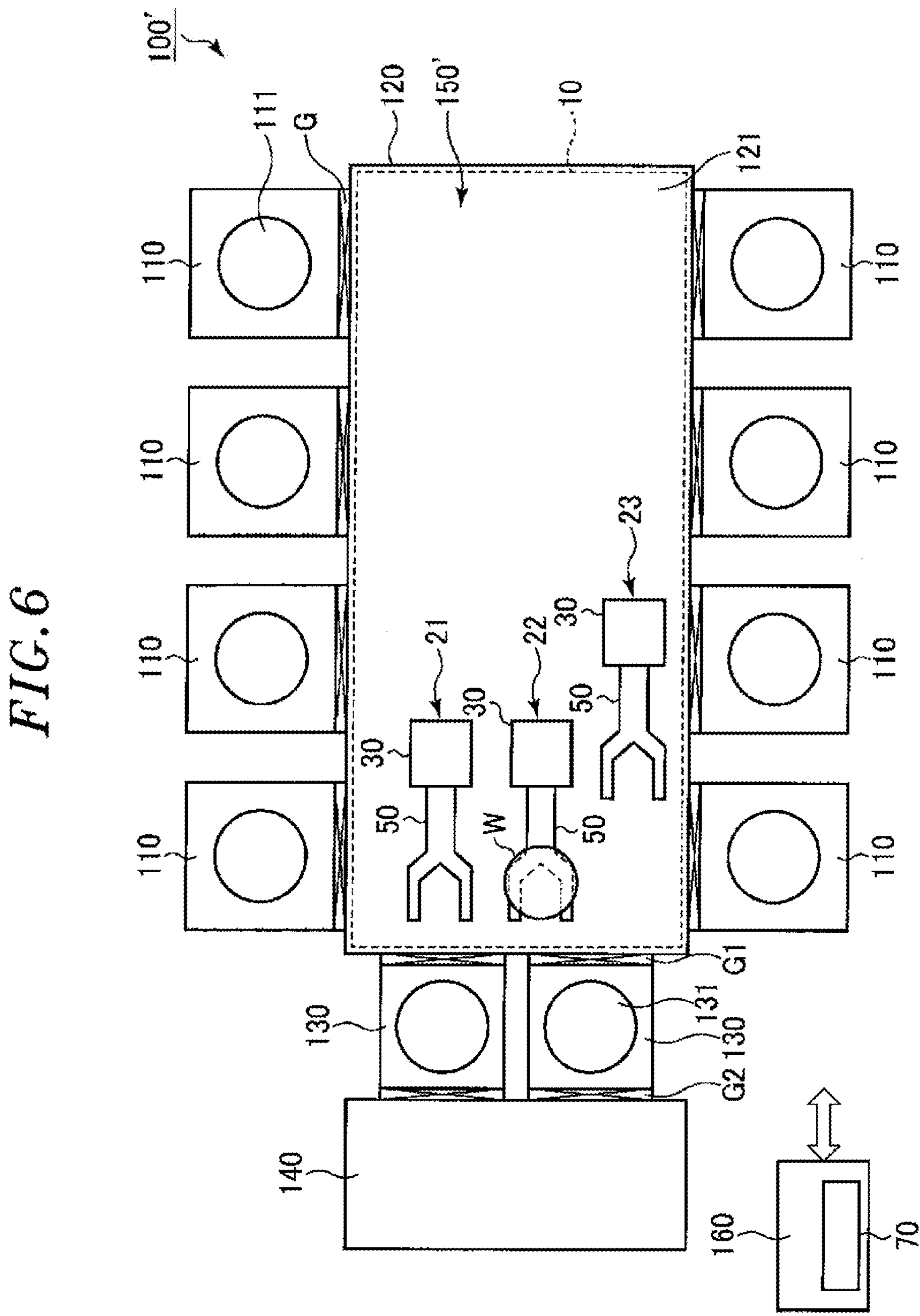
FIG. 6 is a schematic plan view showing a substrate processing system according to a second embodiment.

FIG. 6 is a schematic plan view showing a substrate processing system according to a second embodiment.

Similarly to the substrate processing system 100 according to the first embodiment, a substrate processing system 100' of the present embodiment continuously processes a plurality of substrates.

The substrate processing system 100' of the present embodiment is configured in the same manner as the substrate processing system 100 of the first embodiment, except that a substrate transfer device 150' is provided instead of the substrate transfer device 150. As with the substrate transfer device 150, the substrate transfer device 150' includes the planar motor (linear unit) 10, the first transfer unit 21, and the second transfer unit 22, and further includes a third transfer unit 23. Similarly to the first and second transfer units 21 and 22, the third transfer unit 23 includes the end effector 50, which is a substrate holder for holding the substrate W, and the base 30.

Similarly to the first embodiment, the magnetically levitated base 30 can be moved along the surface of the main body 11 of the planar motor 10 (floor of the vacuum transfer chamber 120) to control its position. As a result, the first transfer unit 21, the second transfer unit 22, and the third transfer unit 23 can be independently and freely moved (linearly movable and swivelable) over the plane along the surface of the main body 11 of the planar motor 10 (floor of the vacuum transfer chamber 120).

The present embodiment is characterized in that an unprocessed substrate and a processed substrate are replaced between the load-lock chamber 130 and the processing chamber 110 using three transfer units, i.e., the first transfer unit 21, the second transfer unit 22, and the third transfer unit 23.

The transfer operation at this time is performed as shown in FIG. 7 under the control of the controller 160 (transfer controller 70). FIGS. 7A to 7G are process diagrams for explaining each step of the substrate replacement operation by the substrate transfer device 150', and schematically show a part of the substrate processing system 100'. In FIGS. 7A to 7G, for the sake of convenience, the first transfer unit 21 is denoted by "1", the second transfer unit 22 is denoted by "2", and the third transfer unit 23 is denoted by "3".

Figure 7A:
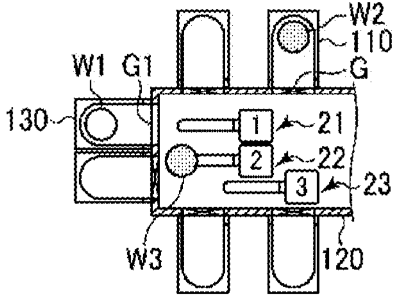
FIGS. 7A to 7G are process diagrams for explaining processes of a substrate replacement operation by a substrate transfer device in the second embodiment.

FIG. 7A shows a reference state in which the unprocessed substrate W1 exists in one load-lock chamber 130, the substrate W2 exists in one processing chamber 110, the first transfer unit 21 and the third transfer unit 23 are empty, and the processed substrate W3 is placed on the second transfer unit 22. The first transfer unit 21 is positioned at the position corresponding to the load-lock chamber 130 in which the unprocessed substrate W1 exists, and the gate valve G1 of the load-lock chamber 130 is open.

Figure 7B:
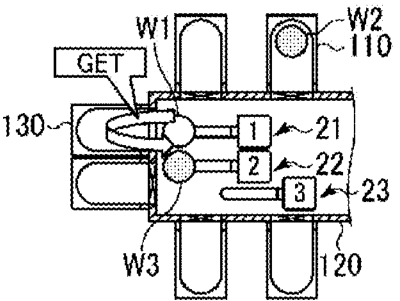

From this state, as shown in FIG. 7B, the unprocessed substrate W1 in the load-lock chamber 130 is taken out by the empty first transfer unit 21 (GET operation).

Figure 7C:
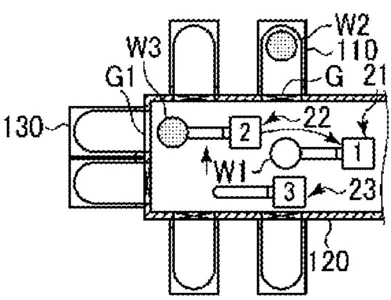

Next, as shown in FIG. 7C, the first transfer unit 21 that has received the unprocessed substrate W1 is retracted, the second transfer unit 22 holding the processed substrate W3 is moved to the position corresponding to the load-lock chamber 130 as the transfer destination, and preparation is made for the transfer of the substrate W3 (PUT preparation).

Figure 7D:
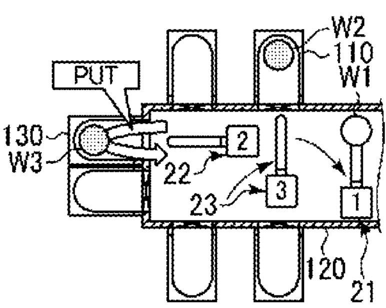

Next, as shown in FIG. 7D, the substrate W3 held by the second transfer unit 22 is transferred to the load-lock chamber 130 (PUT operation), and the first transfer unit 21 holding the substrate W1 is brought into a state of waiting for the substrate W2 to be unloaded from the processing chamber 110. Next, the third transfer unit 23 is moved to the position corresponding to the processing chamber 110 where the substrate W2 exists. The substrate W2 has processed in the processing chamber 110 in which the substrate W2 exists during FIGS. 7A to 7C, and the processing of the substrate W2 has been completed in FIG. 7D.

Figure 7E:
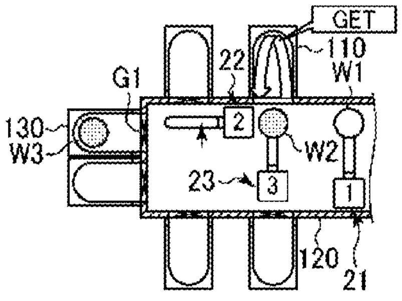

Next, as shown in FIG. 7E, the gate valve G1 of the load-lock chamber 130 is closed. Then, the gate valve G of the processing chamber 110 in which the processed substrate W2 exists is opened, and the third transfer unit 23 takes out the processed substrate W2 from the processing chamber 110 while the first transfer unit 21 is kept in the state of waiting for unloading (GET operation). At this time, the first transfer unit 21 is kept in the state of waiting for unloading, and the second transfer unit 22 remains positioned at the position corresponding to the load-lock chamber 130 to which the substrate W3 has been transferred.

Figure 7F:
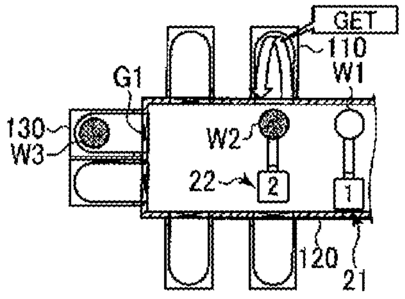

Next, as shown in FIG. 7F, the third transfer unit 23 holding the processed substrate W2 is moved to the position corresponding to the load-lock chamber 130 as the transfer destination, and the first transfer unit 21 holding the unprocessed substrate W1 is moved to the position corresponding to the empty processing chamber 110. The second transfer unit 22 remains positioned at the position corresponding to the load-lock chamber 130 to which the substrate W3 has been transferred.

Figure 7G:
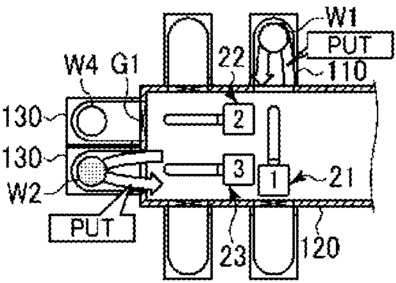

Next, as shown in FIG. 7G, the substrate W1 held by the first transfer unit 21 is transferred to the processing chamber 110 (PUT operation). FIG. 7G also shows a subsequent operation (PUT operation) of opening the gate valve G1 of other load-lock chamber 130 and transferring the substrate W2 held by the third transfer unit 23 to the load-lock chamber 130. On the other hand, prior to the PUT operation of the substrate W2 by the third transfer unit 23, the second transfer unit 22 is ready to receive an unprocessed substrate W4 newly placed in the previous load-lock chamber 130 as shown in the drawing. Although not shown, the second transfer unit 22 then receives the substrate W4 prior to the PUT operation of the substrate W2 by the third transfer unit 23.

FIG. 8 is a table showing the details of each step of the sequence including the substrate replacement operation as described above. Symbols in FIG. 8 are basically the same as those in FIG. 5. Newly added Mover3 indicates the third transfer unit 23, and the column for Mover3 indicates the state of the third transfer unit 23.

In FIG. 8, number 0 indicates the initial state, numbers 1 to 8 indicate the first substrate replacement operation, numbers 9 to 16 indicate the second substrate replacement operation, and numbers 17 to 24 indicate the third substrate replacement operation.

As shown in FIG. 8, in the present embodiment, the operation of taking out the substrate and the operation of transferring the substrate by Mover1, Mover2, and Mover3, and the operation of opening and closing PM GV and LLM GV are performed concurrently in parallel to replace the substrate between LLM and PM.

Specifically, in number 1, the GET operation of taking out the unprocessed substrate (W1) from LLM by Mover1 is performed as a main operation. In number 2, the PUT operation of transferring the processed substrate (W3) to LLM by Mover2 is performed as a main operation, and, at the same time, Mover1 holding the unprocessed substrate (W1) is moved toward PM and Mover3 is moved to the position corresponding to PM as a parallel operation. In number 3, LLM GV is closed as a main operation, and the movement of Mover1 and the movement of Mover3 are continued as a parallel operation. In number 4, PM GV is opened as a main operation, and the movement of Mover1 and the movement of Mover3 are continued as a parallel operation. In number 5, the GET operation of taking out the processed substrate (W2) from PM by Mover3 is performed as a main operation, and the movement of Mover1 is continued as a parallel operation, if necessary. In number 6, the PUT operation of transferring the unprocessed substrate (W1) to PM by Mover1 is performed as a main operation, and, at the same time, Mover3 holding the processed substrate (W2) is moved from PM toward LLM as a parallel operation. In number 7, PM GV is closed as a main operation, and the movement of Mover1 and the movement of Mover3 are continued as a parallel operation, if necessary. In number 8, LLM GV is opened as a main operation, Mover2 is moved to the position corresponding to LLM as a parallel operation, and Mover1 and Mover3 are moved, if necessary.

As the second substrate replacement operation between LLM and PM, number 9 following number 8 above is performed first. In number 9, the GET operation of taking out the unprocessed substrate (W4) from LLM by Mover2 is performed as a main operation. In number 10, the PUT operation of transferring the processed substrate (W2) to LLM by Mover3 is performed as a main operation, and, at the same time, Mover2 holding the unprocessed substrate (W4) is moved toward PM and Mover1 is moved to the position corresponding to PM as a parallel operation. In number 11, LLM GV is closed as a main operation, and the movement of Mover1 and the movement of Mover2 is continued as a parallel operation. In number 12, PM GV is opened as a main operation, and the movement of Mover1 and the movement of Mover2 are continued as a parallel operation. In number 13, the GET operation of taking out the processed substrate (W1) from PM by Mover1 is performed as a main operation, and the movement of Mover2 is continued as a parallel operation, if necessary. In number 14, the PUT operation of transferring the unprocessed substrate (W4) to PM by Mover2 is performed as a main operation, and, at the same time, Mover1 holding the processed substrate (W1) is moved from PM toward LLM as a parallel operation. In number 15, PM GV is closed as a main operation, and the movement of Mover1 and the movement of Mover2 are continued as a parallel operation, if necessary. In number 16, LLM GV is opened as a main operation, Mover3 is moved to the position corresponding to LLM as a parallel operation, and the movement of Mover1 and the movement of Mover2 are continued, if necessary. In other words, in numbers 9 to 16 corresponding to the second substrate replacement operation, the same operation as the first substrate replacement operation is performed only by replacing Mover1, Mover2, and Mover3 with Mover3, Mover1, and Mover2, respectively.

In numbers 17 to 24 corresponding to the third substrate replacement operation, similarly, the same operation as the second substrate replacement operation is performed only by replacing Mover1, Mover2, and Mover3 in the second substrate replacement operation with Mover3, Mover1, and Mover2, respectively.

As described above, in the present embodiment, the first transfer unit 21, the second transfer unit 22, and the third transfer unit 23 can be independently and freely moved (linearly moved and swiveled) on the plane along the surface of the main body 11 of the planar motor 10 (floor of the vacuum transfer chamber 120). Therefore, as shown in FIGS. 7A to 7G and 8, the substrate replacement operation can be performed between the modules by moving the first transfer unit 21, the second transfer unit 22, and the third transfer unit 23 concurrently in parallel. As a result, the substrate replacement operation can be performed with a high degree of freedom and a high throughput regardless of the arrangement of the modules.

In the first embodiment, it is necessary to transfer the processed substrate to the load-lock chamber 130 and take out the processed substrate from the processing chamber 110 by the second transfer unit 22, after the unprocessed substrate is taken out from the load-lock chamber 130 by the first transfer unit 21.

On the other hand, in the present embodiment, for example, after the processed substrate is transferred to the load-lock chamber 130 by the second transfer unit 22, the processed substrate is taken out from the processing chamber 110 by the third transfer unit 23. Therefore, the operation for transferring the substrate to the load-lock chamber 130 by the second transfer unit 22 and the operation for taking out the substrate from the processing chamber 110 by the third transfer unit 23 can be performed concurrently in parallel. In other words, since the transfer unit that has taken out the processed substrate from the processing chamber 110, like Mover3 in numbers 1 to 4 and Mover1 in numbers 7 to 12 in the sequence shown in FIG. 8, does not have a main operation before the taking out operation, it can immediately start the taking out operation. Therefore, compared to the first embodiment, it is possible to shorten the time required for the operation of transferring the processed substrate to the load-lock chamber 130 and the operation of taking out the processed substrate from the processing chamber 110, which makes it possible to shorten the standby time of the transfer unit when transferring an unprocessed substrate to the processing chamber 110. Therefore, in the present embodiment, the time of the parallel operation can be shortened as compared with the first embodiment, and the processing throughput can be increased by about 30% as compared with the first embodiment.

Further, in the present embodiment, the operation margin of the transfer unit is larger than that in the first embodiment, and the high throughput can be maintained even when the system is large and the transfer unit moves a long distance.

Further, although the operation of closing LLM GV in number 3 in the sequence of FIG. 8 and the operation of opening PM GV in number 4 are performed, further improvement in throughput can be expected by performing these operations concurrently or by eliminating the operation of opening and closing the gate valve itself. The effect of improving the throughput at this time is based on the assumption that the time required for the operation of each transfer unit, which is a parallel operation, is short and does not limit the overall processing time, however, in the present embodiment, since the parallel operation can be shortened as compared with the first embodiment, such an effect of further improving the throughput can be obtained.

<Other Applications>

Although the embodiments have been described above, the embodiments disclosed this time should be considered as examples and not restrictive in all respects. The above-described embodiments may be omitted, substituted, or modified in various ways without departing from the scope and spirit of the appended claims.

For example, in the above-described embodiments, although the example in which the substrate processing system includes two transfer units and the example in which the substrate processing system includes three transfer units have been described, the substrate processing system may include four or more transfer units.

Further, in the above embodiments, the case where the transfer unit is transferred using the planar motor has been described, but the present disclosure is not limited thereto, as long as a plurality of transfer units can arbitrarily move along the plane. The configuration of the transfer unit is not limited to the configuration of the base and the end effector as in the present embodiment, and the transfer unit may be one provided with a link mechanism between the base and the end effector, or one provided with a plurality of end effectors.

Further, in the above-described embodiments, the modules for performing the substrate replacement operation are the load-lock chamber and the processing chamber, but the present disclosure is not limited thereto, and the substrate replacement operation between two processing chambers, for example, may be performed.

Further, the substrate is not limited to a semiconductor wafer, and may be a flat panel display (FPD) substrate, a quartz substrate, a ceramic substrate, or other substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate processing system, comprising:

a plurality of modules including a processing chamber in which a substrate is held and processing is performed on the substrate;

a transfer chamber to which the plurality of modules are connected;

a substrate transfer device provided in the transfer chamber, for transferring the substrate to the plurality of modules and taking out the substrate from the plurality of modules;

an openable/closable gate valve provided between the transfer chamber and each of the plurality of modules; and a controller, wherein the substrate transfer device includes a first transfer unit, a second transfer unit, and a third transfer unit, each of which places thereon the substrate and is linearly movable and swivelable independently and freely over a surface of the transfer chamber without being restricted to a predetermined drive line, and the controller controls the substrate transfer device such that a substrate replacement operation is performed from one module to another module among the plurality of modules by moving the first transfer unit, the second transfer unit, and the third transfer unit, the controller controls the substrate transfer device such that at least one transfer unit moves simultaneously with an opening and closing of the gate valve, the controller controls the substrate transfer device to perform as a main operation:

taking out the first substrate which exists in said one module by the first transfer unit;

subsequently transferring the third substrate which exists on the second transfer unit to said one module; and subsequently taking out the second substrate which exists in said another module by the third transfer unit.

2. The substrate processing system of claim 1, wherein when as an initial state the first substrate exists in said one module, the second substrate exists in said another module, and the third substrate exists on the second transfer unit, the controller controls the substrate transfer device to perform as a main operation:

taking out the first substrate which exists in said one module by the first transfer unit;

subsequently transferring the third substrate on the second transfer unit to said one module;

subsequently taking out the second substrate in said another module by the third transfer unit; and subsequently transferring the first substrate to said another module by the first transfer unit.

3. The substrate processing system of claim 2, wherein the controller performs control such that a parallel operation for operating the first transfer unit, the second transfer unit, and/or the third transfer unit is performed while the main operation is performed.

4. The substrate processing system of claim 1, wherein said one module is a load-lock chamber and said another module is the processing chamber.

5. The substrate processing system of claim 1, wherein each of the first transfer unit, the second transfer unit, and the third transfer unit includes a substrate holder for holding the substrate, and a base that has a magnet therein and moves the substrate holder, and the substrate transfer device further comprises a planar motor having a main body constituting a bottom wall of the transfer chamber, a plurality of electromagnetic coils arranged in the main body, and a linear driver that supplies power to the electromagnetic coils, magnetically levitates the base, and linearly drives the base.

6. A substrate processing system, comprising:

a plurality of modules including a processing chamber in which a substrate is held and processing is performed on the substrate;

a transfer chamber to which the plurality of modules are connected;

a substrate transfer device provided in the transfer chamber, for transferring the substrate to the plurality of modules and taking out the substrate from the plurality of modules; and a controller, wherein the substrate transfer device includes a first transfer unit, a second transfer unit and a third transfer unit, each of which places thereon the substrate and is linearly movable and swivelable independently and freely over a surface of the transfer chamber without being restricted to a predetermined drive line, and the controller controls the substrate transfer device such that a substrate replacement operation is performed from one module to another module among the plurality of modules by moving the first transfer unit, the second transfer unit and the third transfer unit, wherein the substrate processing system further comprises an openable/closable gate valve provided between the transfer chamber and each of the plurality of modules, wherein the controller controls the substrate transfer device such that at least one transfer unit moves simultaneously with an opening and closing of the gate valve, wherein when as an initial state a first substrate exists in said one module, a second substrate exists in said another module, a third substrate exists on the second transfer unit, and the gate valve of said one module is opened, the controller controls the substrate transfer device to perform as a main operation:

taking out the first substrate which exists in said one module by the first transfer unit;

subsequently transferring the third substrate on the second transfer unit to said one module;

subsequently closing the gate valve of said one module and, simultaneously, moving the at least one transfer unit;

opening the gate valve of said another module and, simultaneously, moving the at least one transfer unit;

subsequently taking out the second substrate in said another module by the third transfer unit; and subsequently transferring the first substrate to said another module by the first transfer unit.

7. A substrate transfer method for performing a substrate replacement operation from one module to another module among a plurality of modules in a substrate processing system, the substrate processing system comprising the plurality of modules including a processing chamber in which a substrate is held and processing is performed on the substrate, a transfer chamber to which the plurality of modules are connected, a substrate transfer device provided in the transfer chamber for transferring the substrate to the plurality of modules and taking out the substrate from the plurality of modules, and an openable/closable gate valve provided between the transfer chamber and each of the plurality of modules, wherein the substrate transfer device includes a first transfer unit, a second transfer unit, and a third transfer unit, each of which places thereon the substrate and is linearly movable and swivelable independently and freely over a surface of the transfer chamber without being restricted to a predetermined drive line, wherein the substrate transfer method performs a substrate replacement operation from one module to another module among the plurality of modules by moving the first transfer unit, the second transfer unit and the third transfer unit, the substrate transfer method moves the substrate transfer device such that at least one transfer unit moves simultaneously with an opening and closing of the gate valve, the substrate transfer method comprising as a main operation: when as an initial state a first substrate exists in said one module, a second substrate exists in said another module, and a third substrate exists on the second transfer unit, taking out the first substrate which exists in said one module by the first transfer unit;

subsequently transferring the third substrate on the second transfer unit to said one module;

subsequently taking out the second substrate in said another module by the third transfer unit; and subsequently transferring the first substrate to said another module by the first transfer unit.

8. The substrate transfer method of claim 7, comprising as a main operation:

taking out the first substrate which exists in said one module by the first transfer unit;

subsequently transferring the third substrate on the second transfer unit to said one module;

subsequently closing the gate valve of said one module and, simultaneously, moving the at least one transfer unit;

opening the gate valve of said another module and, simultaneously, moving the at least one transfer unit;

subsequently taking out the second substrate in said another module by the third transfer unit; and subsequently transferring the first substrate to said another module by the first transfer unit.

9. The substrate transfer method of claim 7, wherein a parallel operation for operating the first transfer unit, the second transfer unit, and/or the third transfer unit is performed while the main operation is performed.

10. The substrate transfer method of claim 7, wherein said one module is a load-lock chamber and said another module is the processing chamber.

11. The substrate transfer method of claim 7, wherein each of the first transfer unit, the second transfer unit, and the third transfer unit includes a substrate holder for holding the substrate, and a base that has a magnet therein and moves the substrate holder, and the substrate transfer device further comprises a planar motor having a main body constituting a bottom wall of the transfer chamber, a plurality of electromagnetic coils arranged in the main body, and a linear driver that supplies power to the electromagnetic coils, magnetically levitates the base, and linearly drives the base.

* * * * *